(12) United States Patent
Kikumoto

(10) Patent No.: US 10,573,523 B2
(45) Date of Patent: Feb. 25, 2020

(54) SUBSTRATE PROCESSING DEVICE WHICH PERFORMS PROCESSING ON SUBSTRATE

(71) Applicant: SCREEN Holdings Co., Ltd., Kyoto (JP)

(72) Inventor: Noriyuki Kikumoto, Kyoto (JP)

(73) Assignee: SCREEN Holdings Co., Ltd., Kyoto (JP)

(*) Notice: Subject to any disclaimer, the term of this patent is extended or adjusted under 35 U.S.C. 154(b) by 251 days.

(21) Appl. No.: 15/697,043

(22) Filed: Sep. 6, 2017

(65) Prior Publication Data

US 2018/0090332 A1 Mar. 29, 2018

(30) Foreign Application Priority Data

Sep. 27, 2016 (JP) .................................. 2016-187836

(51) Int. Cl.
*H01L 21/30* (2006.01)
*H01L 21/306* (2006.01)
(Continued)

(52) U.S. Cl.
CPC ...... *H01L 21/306* (2013.01); *H01L 21/02046* (2013.01); *H01L 21/02082* (2013.01);
(Continued)

(58) Field of Classification Search
CPC .................................................. H01L 21/306
See application file for complete search history.

(56) References Cited

U.S. PATENT DOCUMENTS

| 2010/0139702 A1 | 6/2010 | Namba | ........................... 134/26 |
| 2014/0048109 A1 | 2/2014 | Namba | ........................ 134/95.1 |

(Continued)

FOREIGN PATENT DOCUMENTS

| CN | 105244299 A | 1/2016 |
| JP | H10-137664 | 5/1998 |

(Continued)

OTHER PUBLICATIONS

Office Action dated Nov. 26, 2018 in counterpart Taiwanese Patent Application No. 106130160 with English translation based on the Japanese translation.

(Continued)

*Primary Examiner* — Jason Y Ko
(74) *Attorney, Agent, or Firm* — Ostrolenk Faber LLP

(57) ABSTRACT

A substrate processing device includes: a substrate holding member which horizontally holds a substrate; a first supply unit which has a first opening opposed to a lower surface of the substrate held by the substrate holding member and supplies fluid from the first opening toward the lower surface of the substrate; an opposing part having an upper surface opposed to the lower surface of the substrate held by the substrate holding member; and a second supply unit which supplies rinsing liquid from a second opening to a concave surface which is recessed on a central side in the upper surface of the opposing part. A height of the first opening is higher than a height of a liquid surface, of the rinsing liquid supplied to the concave surface, when the rinsing liquid overflows the opposing part. Therefore, the opposing part can be highly accurately cleaned.

10 Claims, 9 Drawing Sheets

(51) Int. Cl.
    *H01L 21/687*     (2006.01)
    *H01L 21/67*     (2006.01)
    *H01L 21/02*     (2006.01)
    *H01L 21/304*     (2006.01)

(52) U.S. Cl.
    CPC ...... *H01L 21/304* (2013.01); *H01L 21/67017* (2013.01); *H01L 21/6719* (2013.01); *H01L 21/67028* (2013.01); *H01L 21/67051* (2013.01); *H01L 21/68728* (2013.01); *H01L 21/68785* (2013.01)

(56) References Cited

U.S. PATENT DOCUMENTS

2014/0273498 A1*   9/2014   Kobayashi .......... H01L 21/6708
    438/745
2016/0005630 A1   1/2016   Fujiwara et al.

FOREIGN PATENT DOCUMENTS

| | | |
|---|---|---|
| JP | 2005-260088 A | 9/2005 |
| JP | 2014-179490 | 9/2014 |
| JP | 2015-188031 | 10/2015 |
| KR | 10-2010-0066362 | 6/2010 |

OTHER PUBLICATIONS

Office Action dated Jan. 21, 2019 in counterpart Korean Patent Application No. 10-2017-0116625 with English translation based on the Japanese translation attached. Portions relevant to prior-art based rejections are translated.

Notification of Reason for Refusal dated Jul. 12, 2019 in counterpart Korean Patent Application No. 10-2017-0116625 with English translation obtained from One Portal Dossier.

\* cited by examiner

F I G . 1 1
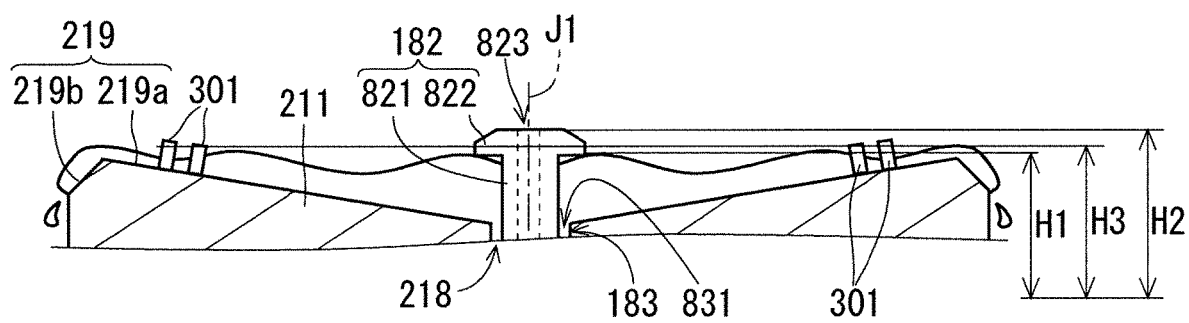

SUBSTRATE PROCESSING DEVICE WHICH PERFORMS PROCESSING ON SUBSTRATE

BACKGROUND OF THE INVENTION

Field of the Invention

The present invention relates to a technology for cleaning an opposing part located under a substrate in a substrate processing device which performs processing on the substrate.

Description of the Background Art

Conventionally, there is known a technology in which processing liquid is supplied to a lower surface of a substrate while the substrate is being rotated. In such a type of device, part of the processing liquid supplied to the lower surface of the substrate is scattered and is stuck to an opposing part having an upper surface opposed to the lower surface of the substrate. If the processing liquid stuck to the upper surface of the opposing part is left as is, the processing liquid can be solidified to be a particle contaminating the substrate; therefore, cleaning processing is performed on the upper surface of the opposing part at appropriate timing.

For example, in the devices described in Japanese Patent Application Laid-Open No. 2014-179490 and Japanese Patent Application Laid-Open No. 2015-188031, the upper surface of the opposing part is configured to be inclined diagonally downward from the central part toward the outer circumferential part. With this arrangement, cleaning liquid is supplied to the central part of the upper surface of the opposing part, and the cleaning liquid flows to the outer circumferential part along the inclination of the upper surface, whereby the cleaning liquid washes away the processing liquid stuck to the upper surface of the opposing part.

However, even if cleaning liquid is supplied to the central part of the upper surface of the opposing part, the processing liquid resides at the upper surface of the opposing part in some cases, and there is a room for improvement in the technology of cleaning the opposing part.

SUMMARY OF THE INVENTION

The present invention is directed to a substrate processing device which performs processing on a substrate.

In one aspect of the present invention, a substrate processing device includes: a substrate holding member which horizontally holds a substrate; a first supply unit which has a first opening opposed to a lower surface of the substrate held by the substrate holding member and supplies fluid from the first opening toward the lower surface; an opposing part having an upper surface opposed to the lower surface of the substrate held by the substrate holding member; and a second supply unit which supplies rinsing liquid from a second opening to a concave surface which is recessed on a central side in the upper surface. A height of the first opening is higher than a height of a liquid surface, of the rinsing liquid supplied to the concave surface, when the rinsing liquid overflows the opposing part.

This substrate processing device can clean the opposing part highly accurately.

The second supply unit preferably supplies the rinsing liquid to the concave surface at a non-holding period in which the substrate holding member is not holding the substrate.

The second supply unit preferably supplies the rinsing liquid to the concave surface at a holding period in which the substrate holding member is holding the substrate, and a height at which the substrate is held in the holding period is higher than the height of the liquid surface.

There is preferably an overlapping period between a first period in which the first supply unit supplies the fluid toward the lower surface and a second period in which the second supply unit supplies the rinsing liquid to the concave surface.

In the overlapping period, the first supply unit preferably supplies toward the lower surface the same type of processing liquid as the rinsing liquid.

In the overlapping period, the first supply unit preferably supplies toward the lower surface a different type of processing liquid from the rinsing liquid.

The substrate processing device preferably includes: a third supply unit which has a third opening opposed to the lower surface of the substrate held by the substrate holding member and supplies gas toward the lower surface from the third opening, where a height of the third opening is higher than the height of the liquid surface.

The upper surface of the opposing part further includes, on an outer circumference side of the concave surface, a tapered surface which is inclined in an obliquely downward direction toward an outer circumferential edge.

Therefore, an object of the present invention is to provide a technology which can clean the opposing part highly accurately.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 9 to 11 are enlarged sectional views each showing a bottom central part 211 and the vicinity thereof.

DESCRIPTION OF THE PREFERRED EMBODIMENTS

Figure 1:
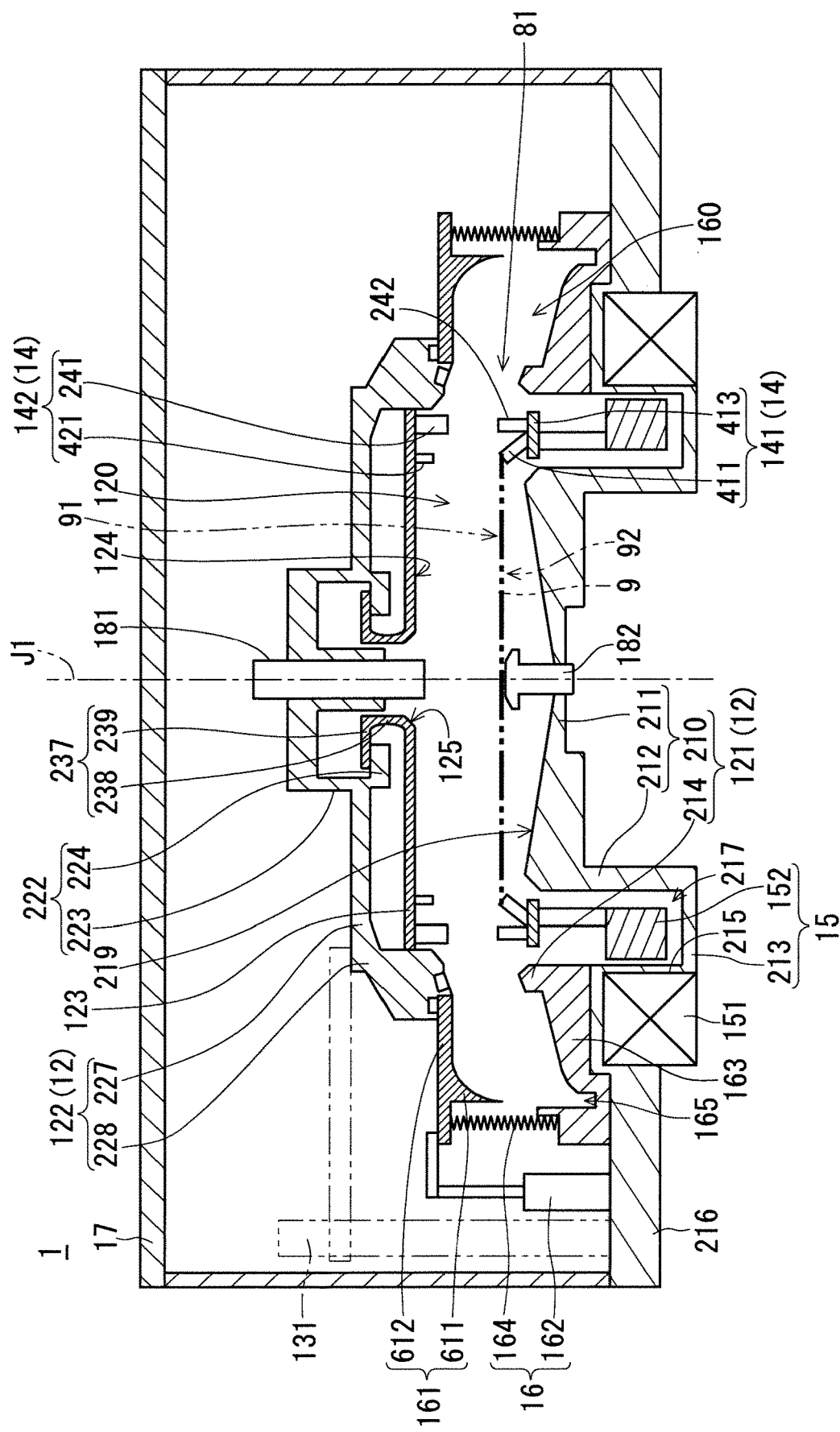
FIG. 1 is a sectional view showing a substrate processing device 1.

Hereinafter, a preferred embodiment will be described with reference to the drawings. In the drawings, parts having similar configurations and functions are assigned the same reference numerals and are not described again. Note that the drawings are schematically drawn.

<1 Preferred embodiment>

<1.1 Configuration of substrate processing device 1>

FIG. 1 is a sectional view showing a substrate processing device 1 according to a preferred embodiment. The substrate processing device 1 is a single wafer type device in which a semiconductor substrate 9 (hereinafter, simply referred to as a "substrate 9") in an approximately disk-shape is supplied with processing liquid and is processed one by one. In FIG. 1, cross-sections of some components of the substrate processing device 1 are not cross-hatched (the other sectional views are drawn in the same way).

The substrate processing device 1 is equipped with a chamber 12, a top plate 123, a chamber opening mechanism 131, a substrate holding member 14, a substrate rotation mechanism 15, a liquid receiving member 16, and a cover 17. The cover 17 covers the upper part and the side part of the chamber 12.

The chamber 12 is equipped with a chamber body 121 and a chamber lid part 122. The chamber 12 has an approximately cylindrical shape centering on a central axis J1 along the vertical direction. The chamber body 121 is equipped with a chamber bottom part 210 and a chamber side wall part 214. The chamber bottom part 210 is equipped with a the bottom central part 211 in an approximately disk-shape, a bottom inner side wall part 212 in an approximately cylindrical shape extending downwardly from an outer edge part of the bottom central part 211, an annular bottom part 213 in an approximately annular plate shape expanding outwardly in the radial direction from a lower end of the bottom inner side wall part 212, a bottom outer side wall part 215 in an approximately cylindrical shape extending upwardly from an outer edge part of the annular bottom part 213, and a base part 216 in an approximately annular plate shape extending outwardly in the radial direction from an upper end part of the bottom outer side wall part 215.

The chamber side wall part 214 has an approximately cylindrical shape centering on the central axis J1 along the vertical direction. The chamber side wall part 214 protrudes upwardly from an inner edge part of the base part 216. The member constituting the chamber side wall part 214 serves as a part of the liquid receiving member 16 as described later. In the following description, the space surrounded by the chamber side wall part 214, the bottom outer side wall part 215, the annular bottom part 213, the bottom inner side wall part 212, and the outer edge part of the bottom central part 211 is referred to as a lower annular space 217.

When a substrate 9 is held by the substrate holding member 14, a lower surface 92 of the substrate 9 is opposed to an upper surface 219 of the bottom central part 211 of the chamber bottom part 210. Therefore, the bottom central part 211 functions as an opposing part having the upper surface 219 opposed to the lower surface 92.

Figure 2:
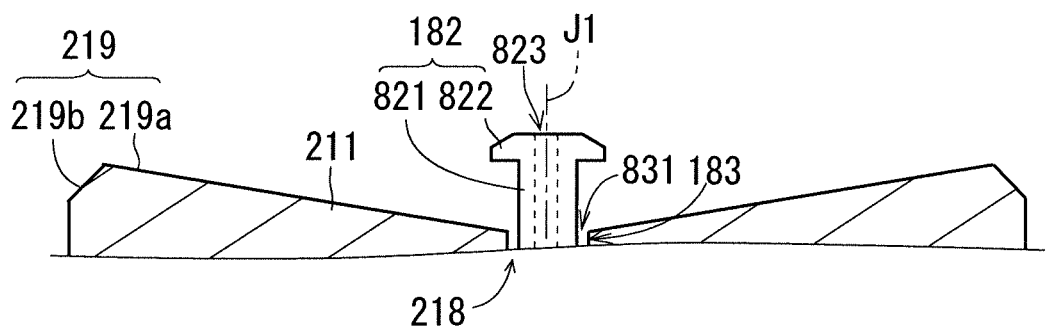
FIG. 2 is an enlarged sectional view showing a bottom central part 211 and a vicinity thereof.

FIG. 2 is an enlarged sectional view showing the bottom central part 211 and the vicinity thereof. The upper surface 219 of the bottom central part 211 is formed of a fluorine-based resin such as Teflon (registered trade mark), for example. The upper surface 219 has a concave surface 219a and a tapered surface 219b. The concave surface 219a is recessed on the central side and is inclined obliquely upwardly in the direction away, in the radial direction, from the central axis J1. The tapered surface 219b is inclined, on the outer circumference side of the concave surface 219a, obliquely downwardly in the direction away, in the radial direction (in other words, toward the outer circumferential edge), from the central axis J1. Therefore, the bottom central part 211 have a funnel shape, which is recessed at the central part.

The chamber lid part 122 has an approximately cylindrical shape with a lid perpendicular to the central axis J1 and includes the upper part of the chamber 12. The chamber lid part 122 is equipped with a canopy part 227 in an approximately disk-shape and an under-lid cylindrical part 228 in an approximately cylindrical shape extending downwardly from the outer edge part of the canopy part 227. The chamber lid part 122 closes an upper opening of the chamber body 121. FIG. 1 shows the state in which the chamber lid part 122 is apart from the chamber body 121. When the chamber lid part 122 closes the upper opening of the chamber body 121, the lower end part of the under-lid cylindrical part 228 is brought into contact with the upper part of the chamber side wall part 214.

Figure 8:
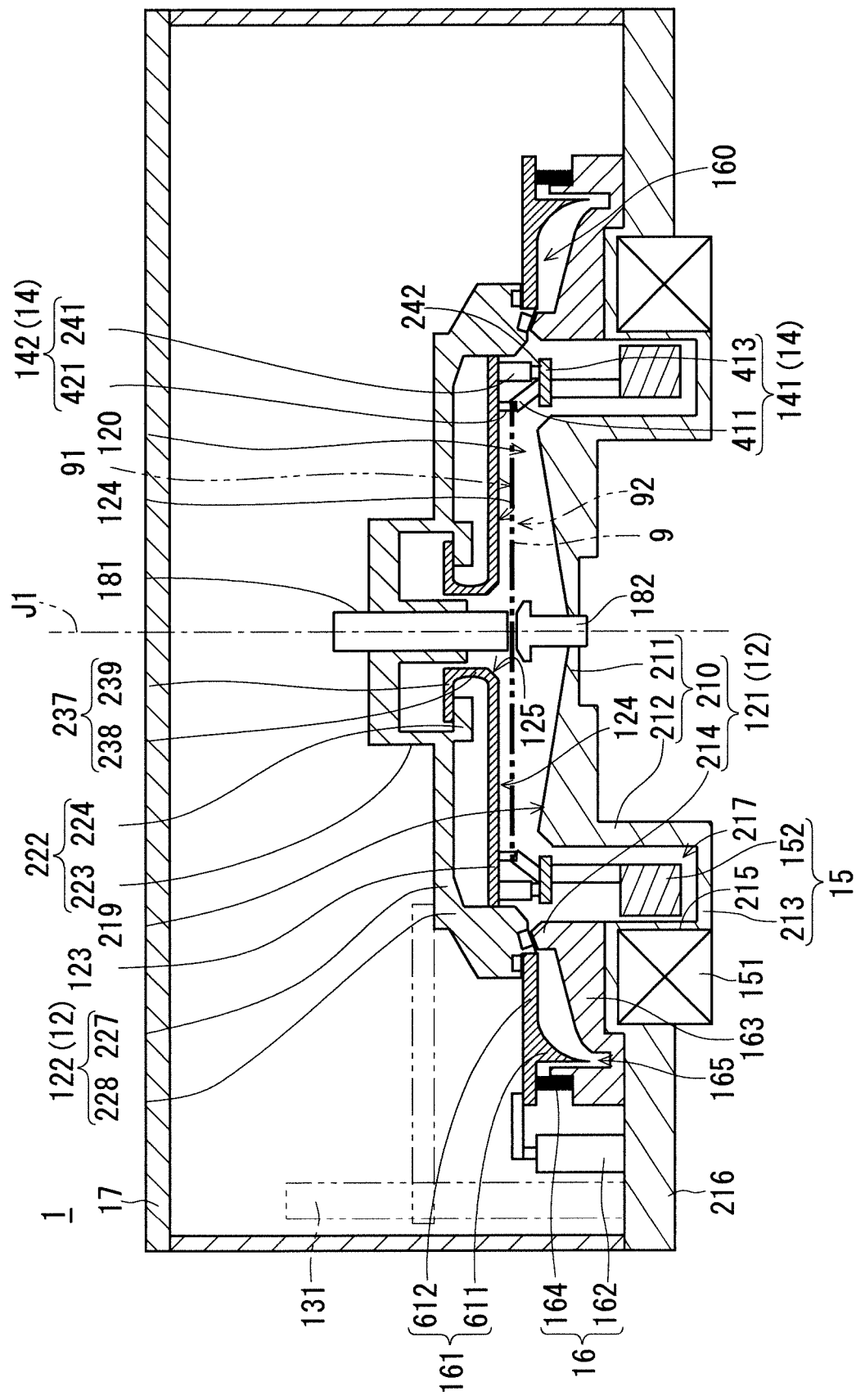

The chamber opening mechanism 131 relatively moves in the vertical direction the chamber lid part 122 as a movable part of the chamber 12 with respect to the chamber body 121 as the other part of the chamber 12. The chamber opening mechanism 131 is a lid part lifting mechanism which moves up and down the chamber lid part 122. When the chamber lid part 122 moves in the vertical direction by the chamber opening mechanism 131, the top plate 123 also moves in the vertical direction together with the chamber lid part 122. By the chamber lid part 122 being brought into contact with the chamber body 121 to close the upper opening and by the chamber lid part 122 being further pressed against the chamber body 121, a chamber space 120 which is an inner space of the chamber 12 is airtightly closed as shown in FIG. 8 to be described later.

The substrate holding member 14 shown in FIG. 1 is disposed in the chamber space 120, which is a space between the chamber lid part 122 and the chamber body 121, and horizontally holds the substrate 9. In a horizontal view, the central axis J1 passes through the center of the substrate 9 held by the substrate holding member 14. The substrate holding member 14 is equipped with: the above substrate supporting member 141 which supports from below the outer edge part (that is, the vicinal part of the outer circumference edge including the outer circumference edge) of the substrate 9 in a horizontal state; and a substrate pressing part 142 which presses from above the outer edge part of the substrate 9 supported by the substrate supporting member 141. In the state shown in FIG. 1, the substrate pressing part 142 is not used.

The substrate supporting member 141 is a member in an approximately annular shape centering on the central axis J1. On the inner side, in the radial direction, of the substrate supporting member 141, is disposed the above bottom central part 211. The substrate supporting member 141 is equipped with: a support base 413 in an approximately annular plate shape centering on the central axis J1; and a plurality of first contact parts 411 fixed on the upper surface of the support base 413. The substrate pressing part 142 is equipped with a plurality of second contact parts 421 fixed on the lower surface of the top plate 123. The positions, in the circumferential direction, of the plurality of second contact parts 421 are actually different from the positions, in the circumferential direction, of the plurality of first contact parts 411.

The top plate 123 has an approximately annular plate shape perpendicular to the central axis J1. The top plate 123 is disposed below the chamber lid part 122 and above the substrate supporting member 141. The top plate 123 has an opening at the center thereof. When a substrate 9 is supported by the substrate supporting member 141, the upper surface 91 of the substrate 9 is opposed to a lower surface 124 of the top plate 123. The diameter of the top plate 123 is larger than the diameter of the substrate 9, and the outer circumference edge of the top plate 123 is on the outside, in the radial direction, of the entire outer circumference edge of the substrate 9. The central axis J1 passes through the centers of the upper surface 91 of the substrate 9 and the lower surface 124 of the top plate 123 and is perpendicular to the upper surface 91 and the lower surface 124.

In the state shown in FIG. 8 to be described later, the top plate 123 is rotated together with the substrate 9 around the central axis J1, and the space between the lower surface 124 of the top plate 123 and the upper surface 91 of the substrate 9 is shut off from the other part of the chamber 12. Therefore, in this state, the top plate 123 functions as a shut-off member. Further, the top plate 123 has a tapered surface 125 extending obliquely upwardly from the inner periphery part of the lower surface 124 toward the central opening.

In the state shown in FIG. 1, the top plate 123 is supported by being suspended by the chamber lid part 122. The chamber lid part 122 has an approximately annular plate holding part 222 at the central part. The plate holding part 222 is equipped with: a cylindrical part 223 in an approximately cylindrical shape centering on the central axis J1; and a flange part 224 in an approximately disk-shape centering on the central axis J1. The flange part 224 extends inwardly, in the radial direction, from the lower end of the cylindrical part 223.

The top plate 123 is equipped with an annular held part 237. The held part 237 is equipped with: a cylindrical part 238 in an approximately cylindrical shape centering on the central axis J1; and a flange part 239 in an approximately disk-shape centering on the central axis J1. The cylindrical part 238 extends upwardly from the upper surface of the top plate 123. The flange part 239 extends outwardly, in the radial direction, from the upper end of the cylindrical part 238. The cylindrical part 238 is on the inner side, in the radial direction, of the cylindrical part 223 of the plate holding part 222. The flange part 239 is above the flange part 224 of the plate holding part 222 and is opposed to the flange part 224 in the vertical direction. With the lower surface of the flange part 239 of the held part 237 being in contact with the upper surface of the flange part 224 of the plate holding part 222, the top plate 123 is attached to the chamber lid part 122, being suspended from the chamber lid part 122.

On the lower surface of the outer edge part of the top plate 123, is arranged a plurality of first engagement members 241 in the circumferential direction, and on the upper surface of the support base 413, is arranged a plurality of second engagement members 242 in the circumferential direction. Actually, the first engagement members 241 and the second engagement members 242 are disposed at positions different, in the circumferential direction, from the positions of the plurality of first contact parts 411 of the substrate supporting member 141 and the plurality of second contact parts 421 of the substrate pressing part 142. It is preferable that three pairs or more of these engagement members be provided, and four pairs are provided in the present preferred embodiment. In the lower parts of the first engagement members 241, there are provided recesses which are recessed upwardly. The second engagement members 242 protrude upwardly from the support base 413.

The substrate rotation mechanism 15 shown in FIG. 1 is a so-called hollow motor. The substrate rotation mechanism 15 is equipped with an annular stator 151 and an annular rotor 152 both centering on the central axis J1. The rotor 152 includes a permanent magnet in an approximately annular shape. The surface of the permanent magnet is molded with PTFE resin. The rotor 152 is disposed in the lower annular space 217 in the chamber space 120 of the chamber 12. On the upper part of the rotor 152 is attached the support base 413 of the substrate supporting member 141 through a connecting member. The support base 413 is disposed above the rotor 152.

The stator 151 is disposed around the rotor 152, on the outside of the chamber 12. In other words, on the outside of the chamber space 120, the stator 151 is disposed on the outside, in the radial direction, of the rotor 152. In the present preferred embodiment, the stator 151 is fixed to the bottom outer side wall part 215 of the chamber bottom part 210 and the base part 216 and is located below the liquid receiving member 16. The stator 151 includes a plurality of coils arranged in the circumferential direction centering on the central axis J1.

When the stator 151 is supplied with current, a rotational force centering on the central axis J1 is generated between the stator 151 and the rotor 152. This rotational force makes the rotor 152 rotate horizontally around the central axis J1 as a rotation axis. By the magnetic force acting between the stator 151 and the rotor 152, the rotor 152 levitates in the chamber 12 without directly or indirectly touching the chamber 12 and makes the substrate 9 rotate, in a levitation state, together with the substrate supporting member 141 around the central axis J1.

The liquid receiving member 16 is equipped with a cup part 161, a cup part moving mechanism 162, a cup opposite part 163, and an outer side wall 164. The cup part 161 has an annular shape centering on the central axis J1 and is on the outside, in the radial direction, of the entire circumference of the chamber 12. The cup part moving mechanism 162 moves the cup part 161 in the vertical direction. In other words, the cup part moving mechanism 162 relatively moves the cup part 161 in the vertical direction with respect to the chamber body 121. The cup part moving mechanism 162 is disposed on the outside, in the radial direction, of the cup part 161. The cup part moving mechanism 162 is disposed at a different position, in the circumferential direction, from the above the chamber opening mechanism 131. The cup opposite part 163 is below the cup part 161 and is vertically opposed to the cup part 161. The cup opposite part 163 is part of the member constituting the chamber side wall part 214. The cup opposite part 163 has an annular liquid receiving recess 165 on the outside, in the radial direction, of the chamber side wall part 214.

The cup part 161 is equipped with a cup side wall part 611 and a cup upper surface part 612. The cup side wall part 611 has an approximately cylindrical shape centering on the central axis J1. The cup upper surface part 612 has an approximately annular plate shape centering on the central axis J1 and extends inwardly and outwardly in the radial direction from the upper end part of the cup side wall part 611.

The outer side wall 164 has an approximately cylindrical shape centering on the central axis J1 and can extend and shrink in the vertical direction. In the example shown in FIG. 1, the outer side wall 164 is a bellows in which there are alternatively arranged in the vertical direction a plurality of mountain fold lines each of which is circular and a plurality of valley fold lines each of which is circular. In the following description, the outer side wall 164 is referred to as a bellows 164. The bellows 164 is on the outside, in the radial direction, of the chamber side wall part 214 and the cup side wall part 611 and is provided on the entire circumferences of the chamber side wall part 214 and the cup side wall part 611. The bellows 164 is made of material impermeable to gas and liquid.

The upper end part of the bellows 164 is connected to the entire outer circumference of the lower surface of the circumferential edge part of the cup upper surface part 612 of the cup part 161. In other words, the upper end of the bellows 164 is indirectly connected to the cup side wall part 611 through the cup upper surface part 612. The connection point between the bellows 164 and the cup upper surface part 612 is sealed, so that gas and liquid are prevented from passing through. The lower end part of the bellows 164 is indirectly connected to the chamber body 121 through the cup opposite part 163. The connection point between the lower end part of the bellows 164 and the cup opposite part 163 also prevent gas and liquid from passing through. The bellows 164 deforms following the movement of the cup part 161 caused by the cup part moving mechanism 162 (that is, the relative movement of the cup part 161 with respect to the chamber body 121) and changes the height in the vertical direction.

Figure 3:
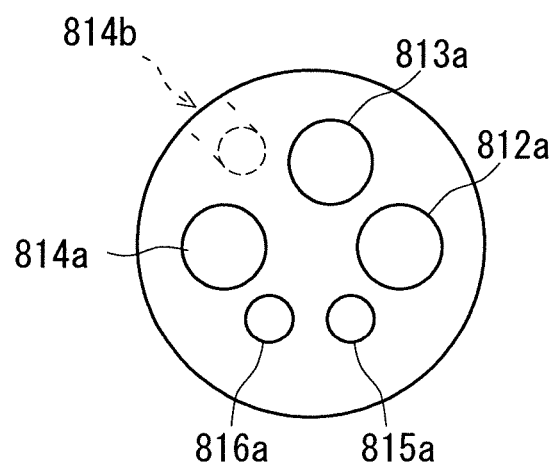
FIG. 3 is a diagram showing a lower surface of an upper nozzle 181.

On the central part of the chamber lid part 122 is fixed an upper nozzle 181 in an approximately cylindrical shape centering on the central axis J1. The upper nozzle 181 can be inserted into the opening at the central part of the top plate 123. The upper nozzle 181 has a plurality of discharge ports in the lower surface and the side surface thereof as shown in FIG. 3 to be described later. On the central part of the bottom central part 211 of the chamber bottom part 210 is attached a lower nozzle 182 in an approximately cylindrical shape centering on the central axis J1.

The lower nozzle 182 is equipped with: a nozzle body 821 in an approximately cylindrical shape centering on the central axis J1; and an eave part 822 in an approximately annular plate shape extending outwardly, in the radial direction, from the upper end of the nozzle body 821. The nozzle body 821 is inserted in an approximately cylindrically shaped through hole 218 formed, along the central axis J1, at the central part of the bottom central part 211. In the central part of the upper end face of the nozzle body 821 is provided a lower surface central discharge port 823 (also referred to as a first opening) to be opposed to the lower surface 92 of the substrate 9 held by the substrate holding member 14. The lower surface central discharge port 823 is provided on the central axis J1 at the central part of the bottom central part 211. The eave part 822 is upwardly apart from the upper surface 219 and extends outwardly in the radial direction.

Because the above through hole 218 has a diameter larger than the outer diameter of the nozzle body 821, there is formed a gap in an approximately cylindrical shape between the outer side surface of the nozzle body 821 and the inner side surface of the through hole 218. The gap functions as a lower annular flow passage 183 (to be described later) through which rinsing liquid flows. The annular upper end opening of the lower annular flow passage 183 (that is, an opening in an approximately annular surface formed between the upper end edge of the through hole 218 and the outer side surface of the nozzle body 821) is referred to as a lower surface annular discharge port 831 (also referred to as a second opening). The lower surface annular discharge port 831 is an annular discharge port provided at the central part of the bottom central part 211 around the lower surface central discharge port 823.

Figure 4:
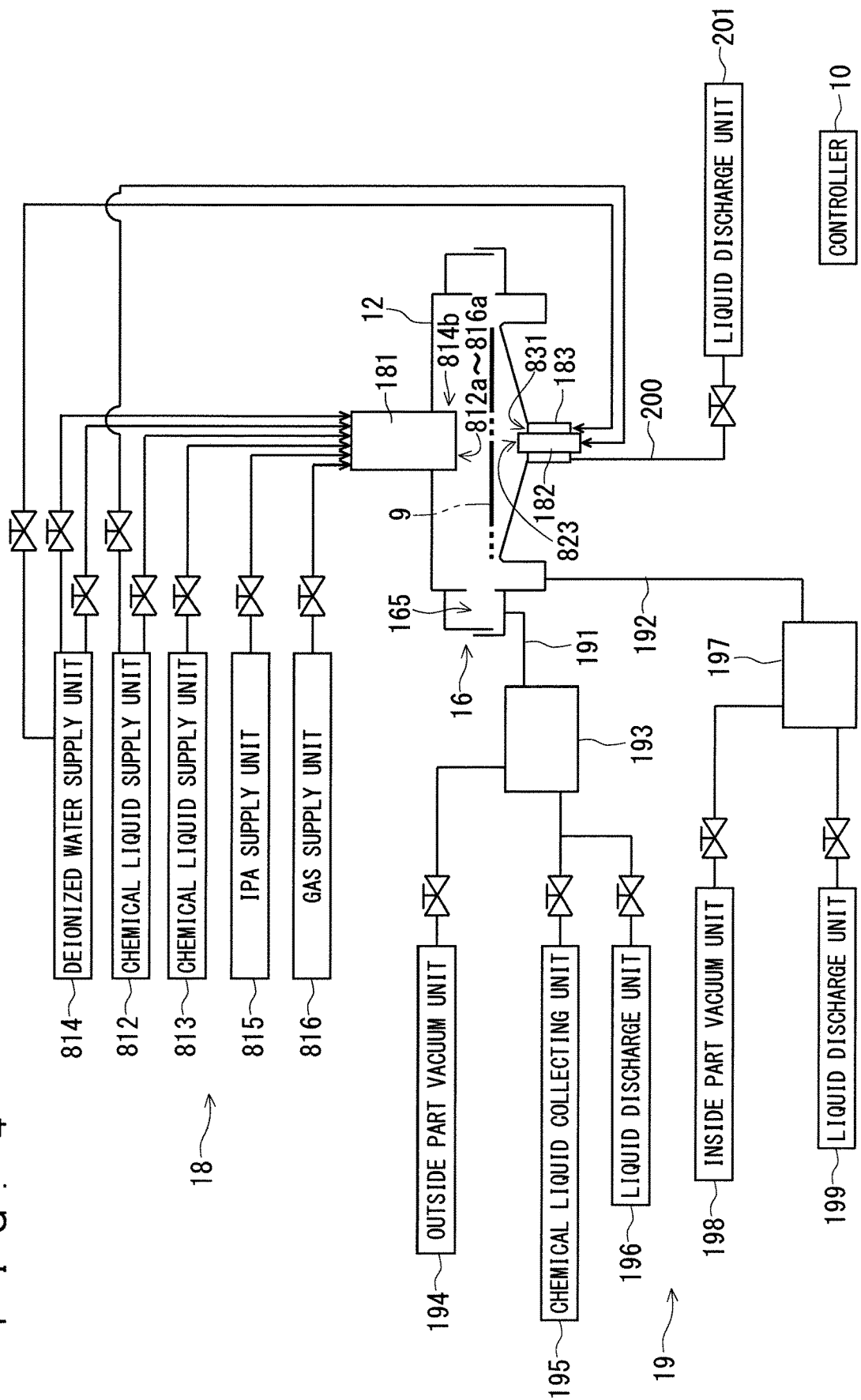
FIG. 4 is a schematic block diagram showing a gas-liquid supply unit 18 and a gas-liquid discharge unit 19.

FIG. 3 is a diagram showing the lower surface of the upper nozzle 181. FIG. 4 is a schematic block diagram showing a gas-liquid supply unit 18 and a gas-liquid discharge unit 19 equipped on the substrate processing device 1. As shown in FIG. 3 and FIG. 4, each of discharge ports 812a to 816a of the gas-liquid supply unit 18 is opened on the lower surface of the upper nozzle 181, and a discharge port 814b of the gas-liquid supply unit 18 is opened on the lower side surface of the upper nozzle 181.

In addition to the above upper nozzle 181, lower nozzle 182, and lower annular flow passage 183, the gas-liquid supply unit 18 is equipped with chemical liquid supply units 812 and 813, a deionized water supply unit 814, an IPA supply unit 815, and a gas supply unit 816.

The chemical liquid supply unit 812 is connected to the upper nozzle 181 and the lower nozzle 182 through valves.

The chemical liquid supplied from the chemical liquid supply unit 812 to the upper nozzle 181 (for example, DHF (diluted hydrofluoric acid)) passes through a flow passage penetrating through the upper nozzle 181 and is discharged toward the upper surface 91 of the substrate 9 from a discharge port 812a provided on the lower surface of the upper nozzle 181. Further, the chemical liquid supplied from the chemical liquid supply unit 812 to the lower nozzle 182 passes through a flow passage penetrating through the lower nozzle 182 and is discharged toward the lower surface 92 of the substrate 9 from the lower surface central discharge port 823 provided on the upper surface of the lower nozzle 182.

A chemical liquid supply unit 813 is connected to the upper nozzle 181 through a valve. The chemical liquid supplied from the chemical liquid supply unit 813 (for example, SC1 liquid, in which hydrogen peroxide water and ammonia are mixed) passes through a flow passage penetrating through the upper nozzle 181 and is discharged toward the upper surface 91 of the substrate 9 from a discharge port 813a provided on the lower surface of the upper nozzle 181.

The deionized water supply unit 814 is connected to the upper nozzle 181 and the lower annular flow passage 183 through valves. The deionized water (DIW) supplied from the deionized water supply unit 814 to one flow passage of the upper nozzle 181 passes through a flow passage penetrating through the upper nozzle 181 and is discharged toward the upper surface 91 of the substrate 9 from a discharge port 814a provided on the lower surface of the upper nozzle 181. Further, the deionized water supplied from the deionized water supply unit 814 to the other flow passage of the upper nozzle 181 passes through a flow passage penetrating through the upper nozzle 181 and is discharged in the horizontal direction from the discharge port 814b provided on the lower side surface of the upper nozzle 181. Further, the deionized water supplied from the deionized water supply unit 814 to the lower annular flow passage 183 passes through a flow passage penetrating through the lower annular flow passage 183 and is discharged toward the central part of the upper surface 219 of the bottom central part 211 from the lower surface annular discharge port 831.

An IPA supply unit 815 is connected to the upper nozzle 181 through a valve. The IPA (isopropyl alcohol) supplied from the IPA supply unit 815 passes through a flow passage penetrating through the upper nozzle 181 and is discharged toward the upper surface 91 of the substrate 9 from a discharge port 815a provided on the lower surface of the upper nozzle 181.

The gas supply unit 816 is connected to the upper nozzle 181 through a valve. The gas (for example, inert gas such as nitrogen gas, or air or the like) supplied from the gas supply unit 816 passes through a flow passage penetrating through the upper nozzle 181 and is discharged toward the inside of the chamber 12 from a discharge port 816a provided on the lower surface of the upper nozzle 181.

Here, the part having the lower nozzle 182 and the chemical liquid supply unit 812 to supply fluid (specifically, DHF) to the lower surface 92 of the substrate 9 functions as a first supply unit. Further, the part which has the lower annular flow passage 183 and the deionized water supply unit 814 and supplies rinsing liquid (specifically, DIW) to the concave surface 219a of the bottom central part 211 functions as a second supply unit.

A first discharge passage 191 connected to the liquid receiving recess 165 of the liquid receiving member 16 is connected to a gas-liquid separation unit 193. The gas-liquid separation unit 193 is connected to each of an outside part vacuum unit 194, a chemical liquid collecting unit 195, and a liquid discharge unit 196 through valves. A second discharge passage 192 connected to the chamber bottom part 210 is connected to a gas-liquid separation unit 197. The gas-liquid separation unit 197 is connected to an inside part vacuum unit 198 and a liquid discharge unit 199 through valves. Further, a third discharge passage 200 connected to the lower annular flow passage 183 is connected to a liquid discharge unit 201 through a valve.

Each component of the gas-liquid supply unit 18 and the gas-liquid discharge unit 19 is controlled by a controller 10. Similarly, the other parts of the substrate processing device 1 (the chamber opening mechanism 131, the substrate rotation mechanism 15, the cup part moving mechanism 162, and the like) are also controlled by the controller 10.

In the present detailed description, chemical liquid, deionized water, and IPA are collectively referred to as processing liquid in some cases. Further, liquid to be used to rinse particles and chemical liquids (typically, deionized water) is referred to as rinsing liquid.

<1.2 Process example of substrate processing device 1>

Figure 5:
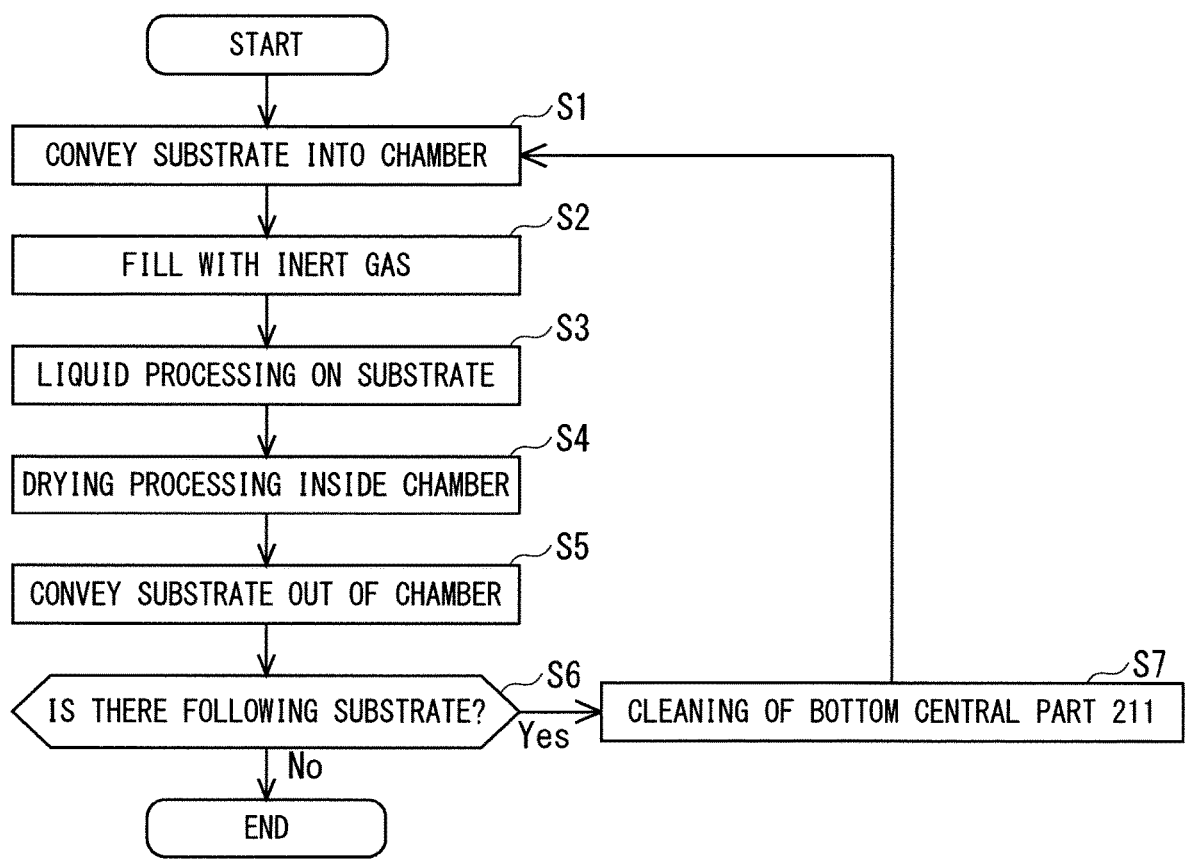
FIG. 5 is a diagram showing an example of a process flow in the substrate processing device 1.
Figure 6:
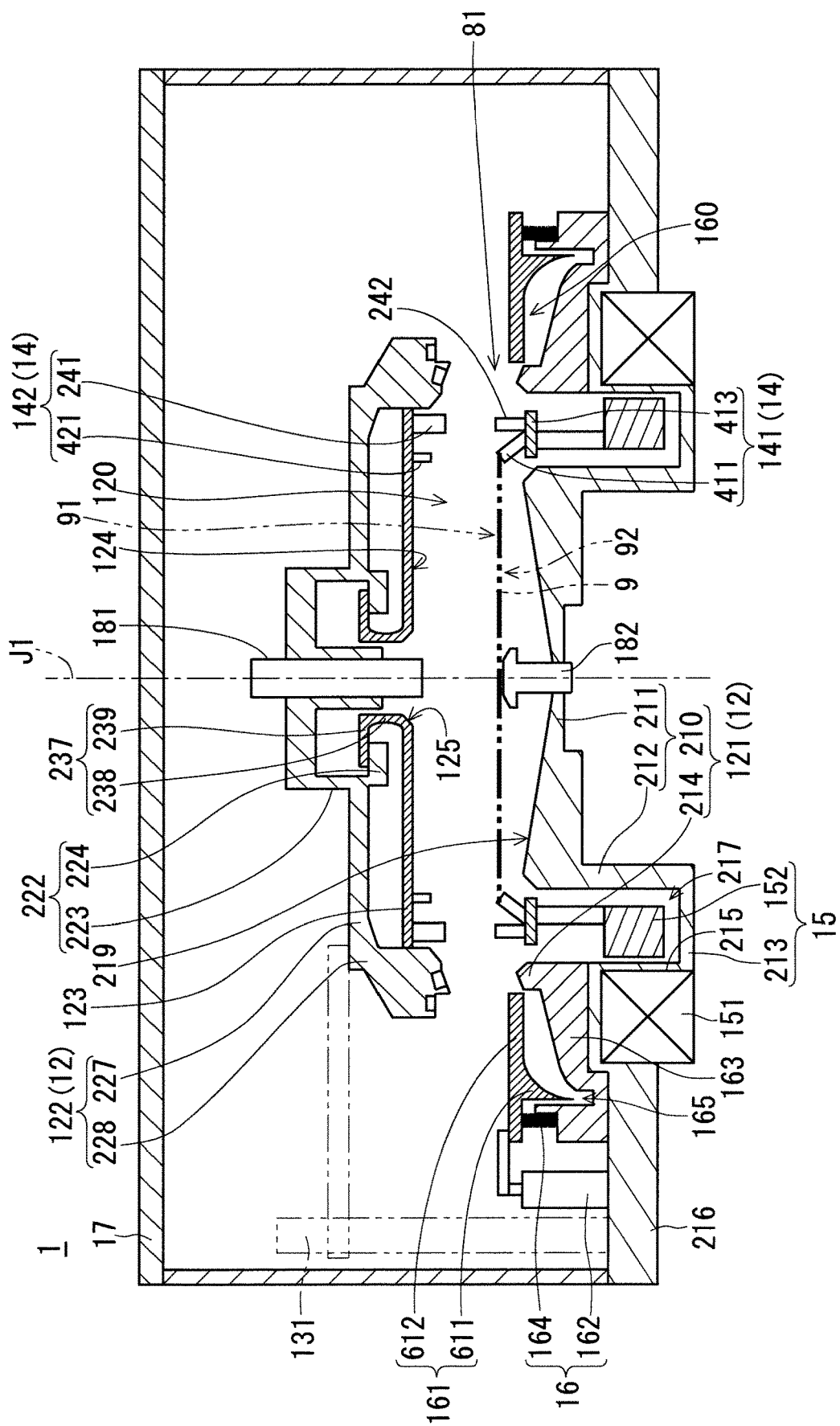
FIGS. 6 to 8 are sectional views of the substrate processing device 1 when processing is being performed.
Figure 7:
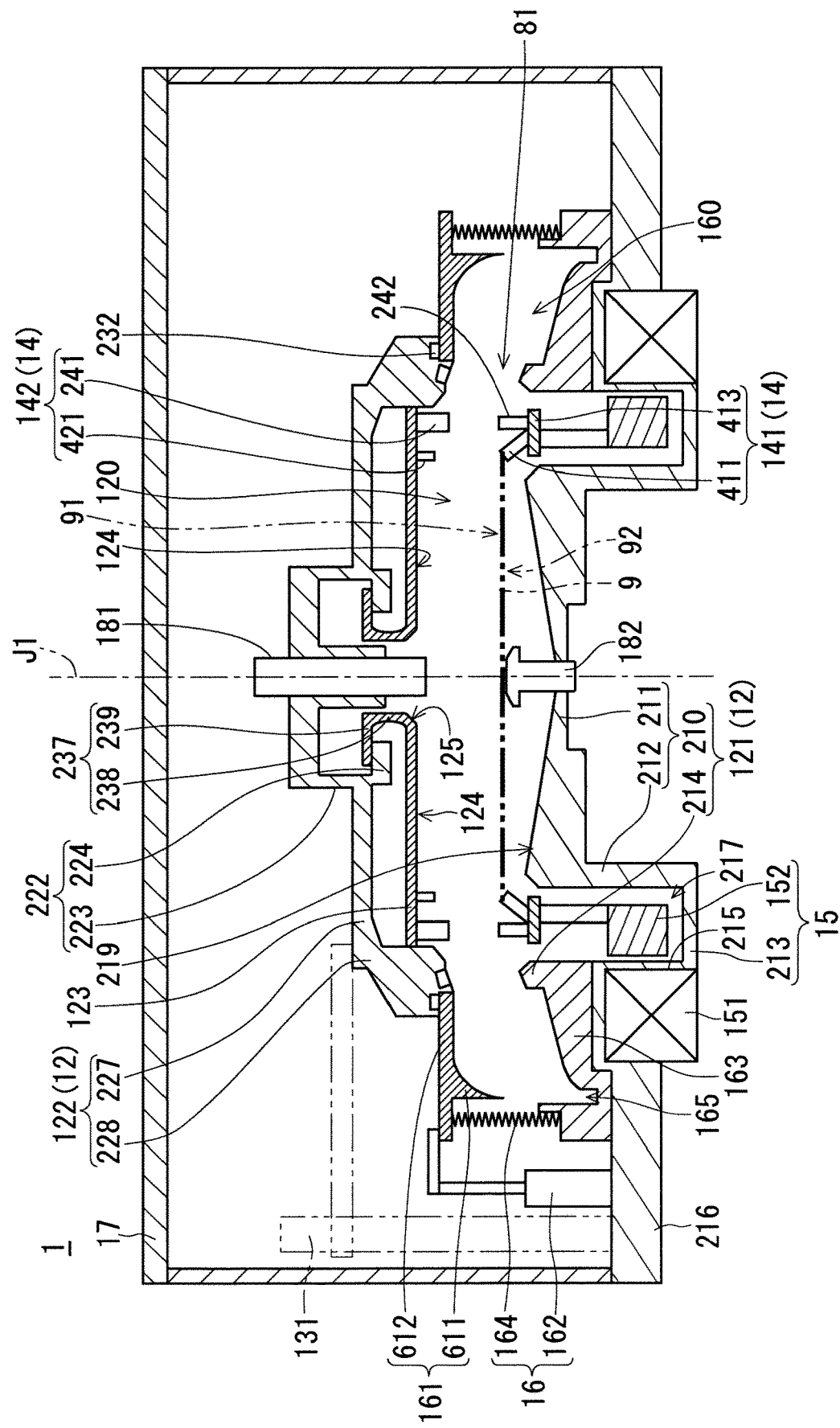

FIG. 5 is a diagram showing an example of a process flow in the substrate processing device 1. FIG. 6 to FIG. 8 are sectional views of the substrate processing device 1 when processing are performed.

As shown in FIG. 6, in the substrate processing device 1, a substrate 9 is conveyed into the chamber 12 by an external conveying mechanism when the chamber lid part 122 is upwardly apart from the chamber body 121 and when the cup part 161 is at a lower position (referred to as a retreat position) downwardly apart from the chamber lid part 122. As a result, the substrate 9 is supported from below by the substrate supporting member 141 (step S1). The state of the chamber 12 and the cup part 161 shown in FIG. 6 is referred to as an "open state." In the open state, there is formed a gap in the vertical direction between the chamber lid part 122 and the chamber side wall part 214. This gap has an annular shape centering on the central axis J1 when viewed from above. This annular gap is referred to as an "annular opening 81." In step S1, a substrate 9 is conveyed to the substrate supporting member 141, passing through the annular opening 81 in a horizontal direction.

When the substrate 9 has been conveyed to the substrate supporting member 141, the cup part moving mechanism 162 lifts the cup part 161 up to the position (referred to a liquid receiving position) shown in FIG. 7 from the retreat position shown in FIG. 6. By this operation, as shown in FIG. 7, the cup part 161 is on the outside, in the radial direction, of the entire circumference of the annular opening 81. The state of the chamber 12 and the cup part 161 at this situation is referred to as a first airtight state (FIG. 1 also shows the same state).

Regarding the cup part 161 at the liquid receiving position, the cup side wall part 611 is opposed in the radial direction to the annular opening 81. Further, the upper surface of the inner edge part of the cup upper surface part 612 is in contact with the entire circumference of a lip seal 232 on the lower end of the outer edge part of the chamber lid part 122 (that is, the lower end of the under-lid cylindrical part 228). Between the chamber lid part 122 and the cup upper surface part 612 of the cup part 161 is formed a sealing member to prevent gas and liquid from passing through. This arrangement forms an airtightly closed space surrounded by the chamber body 121, the chamber lid part 122, the cup part 161, the bellows 164, and the cup opposite part 163 (hereinafter, the airtightly closed space is referred to as an extended airtight space 100). The extended airtight space 100 is a space constituted by the chamber space 120 and a side space 160 being communicated with each other through the annular opening 81, where the chamber space 120 is between the chamber lid part 122 and the chamber body 121, and the side space 160 is surrounded by the cup part 161, the bellows 164, and the cup opposite part 163. Here, the side space 160 is a space which is formed between the cup part 161 and the cup opposite part 163 and has an approximately annular shape.

Subsequently, the substrate rotation mechanism 15 starts to rotate the substrate 9. Further, the gas supply unit 816 supplies, from the discharge port 816a through the opening of the top plate 123, inert gas (nitrogen gas, in the present invention) to the space between the upper surface 91 of the substrate 9 and the lower surface 124 of the top plate 123 (gas supplying step). Further, the outside part vacuum unit 194 starts to discharge the gas in the extended airtight space 100. By this operation, after a predetermined lapse of time, the extended airtight space 100 comes into an atmosphere filled with inert gas (that is, an atmosphere in which an oxygen concentration and humidity are lower than before being filled with inert gas) (step S2).

After the atmosphere filled with inert gas is produced, the chamber lid part 122 and the cup part 161 move downwardly in synchronism with each other. Then, as shown in FIG. 8, a lip seal 231 on the lower end of the outer edge part of the chamber lid part 122 (that is, the lower end of the under-lid cylindrical part 228) comes in contact with the upper part of the chamber side wall part 214, whereby the annular opening 81 is closed, and the chamber space 120 is airtightly closed, being separated from the side space 160. The cup part 161 is at the retreat position in the same manner as in FIG. 6. Hereinafter, the state of the chamber 12 and the cup part 161 shown in FIG. 8 is referred to as a second airtight state.

In the second airtight state, a plurality of the second contact parts 421 of the substrate pressing part 142 is in contact with the outer edge part of the substrate 9. On the lower surface 124 of the top plate 123 and on the support base 413 of the substrate supporting member 141, there is provided a plurality pairs of magnets (not shown), where the magnets in each pair are vertically opposed to each other. Here, each of the pairs of magnets is also referred to as a magnet pair. In the substrate processing device 1, a plurality of the magnet pairs is arranged, at equal angles in the circumferential direction, at the different positions from the first contact parts 411, the second contact parts 421, the first engagement members 241, and the second engagement members 242. When the substrate pressing part 142 is in contact with the substrate 9, a downward force acts on the top plate 123 due to a magnetic force (attracting force) acting in each of the magnet pairs. By this force, the substrate pressing part 142 presses the substrate 9 toward the substrate supporting member 141.

In the substrate processing device 1, the substrate pressing part 142 presses the substrate 9 toward the substrate supporting member 141 by the weight of the top plate 123 and by the magnetic force of the magnet pairs, whereby the substrate 9 is firmly held, being nipped vertically by the substrate pressing part 142 and the substrate supporting member 141.

In the second airtight state, the flange part 239 of the held part 237 is upwardly apart from the flange part 224 of the plate holding part 222, and the plate holding part 222 and the held part 237 are not in contact with each other. In other words, the top plate 123 is not held by the plate holding part 222. Therefore, the top plate 123 is independent from the chamber lid part 122 and is rotated, by the substrate rotation mechanism 15, together with the substrate holding member 14 and with the substrate 9 held by the substrate holding member 14 (rotation step). As described above, the substrate rotation mechanism 15 functions as a rotary member which rotates the substrate 9 and the top plate 123 around the central axis J1.

Further, in the second airtight state, the second engagement members 242 are fit in the recessions of the lower part of the first engagement members 241. With this arrangement, the top plate 123 is engaged with the support base 413 of the substrate supporting member 141 in the circumferential direction centering on the central axis J1. In other words, the first engagement members 241 and the second engagement members 242 are a position regulation member which regulates the relative position, in the rotational direction, of the top plate 123 with respect to the substrate supporting member 141 (in other words, fixes the top plate 123 on the substrate supporting member 141 in the circumferential direction). When the chamber lid part 122 comes down, the substrate rotation mechanism 15 controls the rotational position of the support base 413 so that the first engagement members 241 and the second engagement members 242 can fit with each other.

In the second airtight state, because the chamber space 120 and the side space 160 are each independently closed airtightly, the outside part vacuum unit 194 (see FIG. 4) stops discharging gas, and the inside part vacuum unit 198 starts to discharge the gas in the chamber space 120. Note that, the supply of the inert gas to the chamber space 120 and the discharge of the gas in the chamber space 120 may be started in the first airtight state shown in FIG. 7; however, alternatively, the supply and the discharge may be started in the open state shown in FIG. 6 or in the second airtight state shown in FIG. 8. In any case, the chamber lid part 122 and the cup part 161 are annularly, in a horizontal view, in contact with each other so that the first airtight state or the second airtight state is established, whereby the above atmosphere filled with inert gas is produced. As described above, the chamber lid part 122 and the cup part 161 functions as a sealing member which airtightly closes the space communicating with the space between the upper surface 91 of the substrate 9 and the lower surface 124 of the top plate 123 such that the communicating space is separated from the other space in the cover 17.

When the atmosphere filled with inert gas is produced, liquid processing is performed on the substrate 9 (step S3). Hereinafter, an example of the liquid processing on the substrate 9 will be described.

First, the chemical liquid supply unit 812 continuously supplies chemical liquid (for example, DHF) to the upper surface 91 of the substrate 9 being rotated, from the discharge port 812a provided on the lower surface of the upper nozzle 181. The chemical liquid having landed on the upper surface 91 is spread, by the rotation of the substrate 9, to the outer circumferential part of the substrate 9, and the entire upper surface 91 is covered with the chemical liquid. As a result, chemical processing with DHF is progressed on the entire upper surface 91. The chemical liquid (for example, DHF) supplied on the upper surface 91 of the substrate 9 is scattered, by the rotation of the substrate 9, from the outer circumference edge of the substrate 9 to the outer side in the radial direction. The chemical liquid scattered from the substrate 9 is received by the inner wall of the chamber 12 (that is, the inner wall of the under-lid cylindrical part 228 and the inner wall of the chamber side wall part 214) and is discarded through the second discharge passage 192, the gas-liquid separation unit 197, and the liquid discharge unit 199 shown in FIG. 4.

Further, in parallel to the chemical processing on the upper surface 91 of the substrate 9, the chemical liquid supply unit 812 supplies chemical liquid (for example, DHF) also to the lower surface 92 of the substrate 9 being rotated, from the lower surface central discharge port 823 provided on the upper surface of the lower nozzle 182. The chemical liquid having landed on the lower surface 92 is spread, by the rotation of the substrate 9, to the outer circumferential part of the substrate 9, and the entire lower surface 92 is covered with the chemical liquid. As a result, chemical processing with DHF is advanced on the entire lower surface 92. The chemical liquid (for example, DHF) supplied on the lower surface 92 of the substrate 9 is scattered, by the rotation of the substrate 9, from the outer circumference edge of the substrate 9 to the outer side in the radial direction. The chemical liquid scattered from the substrate 9 is received by the inner wall of the chamber 12 and is discarded through the second discharge passage 192, the gas-liquid separation unit 197, and the liquid discharge unit 199 shown in FIG. 4. The rotation speed of the substrate 9 and the top plate 123 during this period is 800 rpm, for example.

When the chemical processing on the upper surface 91 and the lower surface 92 of the substrate 9 is finished, the deionized water supply unit 814 continuously supplies deionized water (that is, rinsing liquid) to the upper surface 91 of the substrate 9 being rotated, from the discharge port 814a provided on the lower surface of the upper nozzle 181. The deionized water having landed on the upper surface 91 is spread, by the rotation of the substrate 9, to the outer circumferential part of the substrate 9 and is scattered together with the chemical liquid (for example, DHF) remaining on the upper surface 91 from the outer circumference edge of the substrate 9 to the outer side in the radial direction. The chemical liquid and the deionized water scattered from the substrate 9 are received by the inner wall of the chamber 12 and are discarded through the second discharge passage 192, the gas-liquid separation unit 197, and the liquid discharge unit 199 shown in FIG. 4. By this operation, in addition to the rinsing processing on the upper surface 91 of the substrate 9, cleaning of the inside of the chamber 12 is also substantially performed. The rotation speed of the substrate 9 and the top plate 123 during this period is 1,200 rpm, for example.

When the rinsing processing on the upper surface 91 of the substrate 9 is finished, the substrate 9 and the top plate 123 are controlled to rotate at the same rotation speed (for example, 1,200 rpm) as before. By this operation, the liquids supplied to the lower surface 124 of the top plate 123 and the upper surface 91 and the lower surface 92 of the substrate 9, are scattered from the outer circumference edge to the outer side, in the radial direction. The scattered liquids are received by the inner wall of the chamber 12 and are discarded through the second discharge passage 192, the gas-liquid separation unit 197, and the liquid discharge unit 199 shown in FIG. 4.

Next, the IPA supply unit 815 continuously supplies IPA to the upper surface 91 of the substrate 9 being rotated, from the discharge port 815a provided on the lower surface of the upper nozzle 181. The IPA having landed on the upper surface 91 is spread, by the rotation of the substrate 9, to the outer circumferential part of the substrate 9, and the entire upper surface 91 is covered with the IPA. As a result, the deionized water is replaced by the IPA on the entire upper surface 91. Further, the rotation speed of the substrate 9 and the top plate 123 during this period is 800 rpm, for example.

Further, during the period in which this IPA processing is performed, the upper surface 91 of the substrate 9 is covered by a liquid film of the processing liquid (specifically, IPA liquid). Also during this period, because the gas supplying step continues, the atmosphere filled with inert gas is produced (that is, an atmosphere in which an oxygen concentration and humidity are lower than before being filled with the inert gas) in the chamber space 120. As described above, because the lower surface 124 of the top plate 123 is prompted to become dry while the processing liquid is on the upper surface 91 of the substrate 9, if foreign matter attached to the lower surface 124 in the step of drying (for example, a contamination source for the substrate such as a particle) falls off, the foreign matter is received by the liquid film on the upper surface 91 of the substrate 9, whereby the foreign matter is not likely to be attached to the upper surface 91.

In the above, an aspect is described as an example of the liquid processing on the substrate 9. In the aspect, chemical processing (specifically, DHF processing), rinsing processing, and IPA processing are serially performed on the upper surface 91 of the substrate 9, and chemical processing (specifically, DHF processing) is performed on the lower surface 92 of the substrate 9. As another example of the liquid processing, an aspect is also possible, in which, for example, chemical processing (specifically, DHF processing), rinsing processing, chemical processing (specifically, SC1 processing), rinsing processing, and IPA processing are serially performed on the upper surface 91 of the substrate 9, and chemical processing (specifically, DHF processing) is performed on the lower surface 92 of the substrate 9.

Further, rinsing processing may be performed on the lower surface 124 of the top plate 123 at an appropriate timing. In this case, the deionized water supply unit 814 continuously supplies deionized water (that is, rinsing liquid) from the discharge port 814*b* toward the lower surface 124 of the top plate 123 and the tapered surface 125 which are rotated. By this operation, the deionized water having landed on the lower surface 124 and the tapered surface 125 is spread, by the rotation of the top plate 123, to the outer circumferential part of the top plate 123 and is scattered from the outer circumference edge of the top plate 123 to the outer side in the radial direction together with the chemical liquid (for example, DHF accidentally attached in the chemical processing) attached to the lower surface 124 and the tapered surface 125. The chemical liquid and the deionized water scattered from the top plate 123 are received by the inner wall of the chamber 12 and is discarded through the second discharge passage 192, the gas-liquid separation unit 197, and the liquid discharge unit 199 shown in FIG. 4. By the above process, in addition to the rinsing processing on the lower surface 124 of the top plate 123 and the tapered surface 125, cleaning of the inside of the chamber 12 is also substantially performed.

When the liquid processing on the substrate 9 is finished, drying processing is performed (step S4). At a rotating step in the drying processing, the substrate 9 and the top plate 123 are rotated at a higher speed than in the previous liquid processing. The rotation speed of the substrate 9 and the top plate 123 during this period is 2,000 rpm, for example. By this rotation, various liquids attached to the substrate 9 and the top plate 123 are scattered from the outer circumference edge to the outer side in the radial direction, and the scattered liquids are received by the inner wall of the chamber 12 and discarded through the second discharge passage 192, the gas-liquid separation unit 197, and the liquid discharge unit 199 shown in FIG. 4. In addition, an airflow is generated in association with a high-speed rotation of the substrate 9 and the top plate 123, and the air flow helps to dry various parts in the chamber 12. This drying processing may be performed in a reduced-pressure atmosphere in which the pressure in the chamber space 120 is reduced lower than the atmospheric pressure by the inside part vacuum unit 198.

When the drying processing is finished, the chamber lid part 122 is lifted up to put the chamber 12 into an open state shown in FIG. 6, and the substrate 9 is conveyed out of the chamber 12 by an external conveying mechanism (step S5). In the present preferred embodiment, because the drying processing (step S4) has been previously performed, there is almost no adhered substance on the lower surface 124 of the top plate 123 in the conveying-out processing (step S5). Therefore, an adhered substance is prevented from falling down on the substrate 9 from the top plate 123 when the chamber lid part 122 is lifted up.

Next, it is determined whether the process is continued also on the following substrate 9 (step S6).

If the flow branches to "Yes" in step S6, cleaning processing is performed on the bottom central part 211 (step S7) before the following substrate 9 is conveyed in (step S1 for the following substrate 9).

Figure 9:
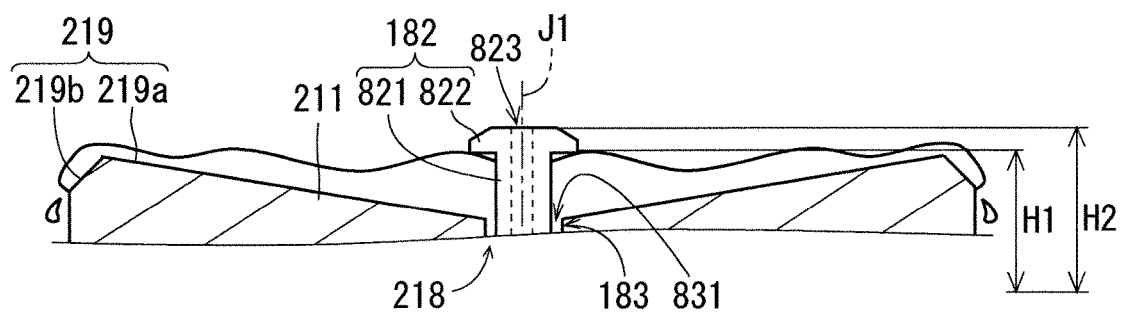

In step S7, the deionized water supply unit 814 supplies deionized water (that is, rinsing liquid) to the central part of the concave surface 219*a* of the bottom central part 211 from the lower surface annular discharge port 831 of the lower annular flow passage 183. Different from the substrate 9 and the top plate 123, the bottom central part 211 is not structured to rotate. The deionized water is continuously supplied from the lower annular flow passage 183 and is gradually stored in the concave surface 219*a*, and the liquid surface of the deionized water is raised. Then, when the liquid surface exceeds the boundary part between the concave surface 219*a* and the tapered surface 219*b* (the annular ridge of the upper surface 219), the deionized water supplied to the concave surface 219*a* goes through the tapered surface 219*b* and overflows the bottom central part 211. FIG. 9 is an enlarged sectional view showing the bottom central part 211 and the vicinity thereof at this point of time.

At this time, the chemical liquid and the foreign matter (for example, DHF accidentally stuck, in the chemical processing, to the lower surface 92, hereinafter, referred to as foreign matter or the like) stuck to the upper surface 219 of the bottom central part 211 are washed away by the deionized water supplied to the concave surface 219*a* and flow out from the outer circumference edge of the upper surface 219 outwardly in the radial direction. The deionized water, the chemical liquid, and the foreign matter having flown out from the outer circumference edge of the upper surface 219 outwardly in the radial direction are discarded through the second discharge passage 192, the gas-liquid separation unit 197, and the liquid discharge unit 199 shown in FIG. 4. By this operation, in addition to the rinsing processing on the upper surface 219 of the bottom central part 211, cleaning of the inside of the chamber 12 is also substantially performed.

Further, when a predetermined time (for example, 30 seconds) has passed since the deionized water is supplied to the concave surface 219*a*, the liquid discharge unit 201 performs a suctioning operation (for example, a suctioning operation using a suck back valve) through the lower annular flow passage 183 and the third discharge passage 200. By this operation, the deionized water stored in the concave surface 219*a* is swiftly discharged from the concave surface 219a by the liquid discharge unit 201. At this time, the foreign matter or the like (for example, DHF accidentally stuck, in the chemical processing, to the lower surface 92) stuck to the upper surface 219 of the bottom central part 211 is also swiftly discharged together with the deionized water stored in the concave surface 219a from the concave surface 219a by the liquid discharge unit 201.

Because the following substrate 9 is conveyed in the state at which the bottom central part 211 is cleaned in step S7, it is possible to decrease a risk that the substrate 9 will be contaminated due to the existence of the foreign matter or the like which was stuck to the upper surface 219 of the bottom central part 211.

If steps S1 to S7 are repeated for a predetermined number of substrates 9 (for example, substrates 9 in one lot) and then the flow branches to "No" in step S6, the process in the substrate processing device 1 is finished.

<1.3 Effects>

Hereinafter, the effects of the substrate processing device 1 and the process example of the present preferred embodiment will be described.

As described above, in step S7 of the present preferred embodiment, both the overflow processing and the suction processing are executed. In the overflow processing, the foreign matter or the like stuck to the upper surface 219 is removed by the deionized water made to overflow the bottom central part 211, and in the suction processing the foreign matter or the like stuck to the upper surface 219 is removed by swiftly sucking the deionized water stored in the concave surface 219a.

Then, in the overflow processing, a force toward the outer circumference side generated by the flow of the deionized water acts on the foreign matter or the like stuck to the upper surface 219. On the other hand, in the suction processing, a force toward the center generated by the flow of the deionized water acts on the foreign matter or the like stuck to the upper surface 219. Because the forces act on the foreign matter or the like in the two opposing directions as described above, the aspect of the present preferred embodiment can more accurately remove the foreign matter than the aspect in which only the force in one direction toward the outer circumference side acts on the foreign matter or the like as in Japanese Patent Application Laid-Open No. 2014-179490 and Japanese Patent Application Laid-Open No. 2015-188031.

In addition, in the present preferred embodiment, the deionized water is stored in the concave surface 219a in order to remove the foreign matter or the like stuck to the upper surface 219. Further, the upper surface 219 is configured with the concave surface 219a and the slope of the tapered surface 219b. Therefore, a gravity force acts on the foreign matter or the like stuck to the upper surface 219 from the deionized water above the foreign matter or the like, and the foreign matter or the like is easily removed along the slope.

Further, in the present preferred embodiment, a height H2 of the lower surface central discharge port 823 from a reference surface is higher than a liquid surface height H1 of the deionized water from the reference surface in the overflow processing. That is, in the overflow processing, the upper end of the lower nozzle 182 protrudes above the liquid surface of the deionized water. This arrangement can prevent, in the overflow processing, the deionized water and the foreign matter or the like removed from the bottom central part 211 by the deionized water from entering the inside of the nozzle body 821 through the lower surface central discharge port 823.

In addition, in the present preferred embodiment, the deionized water supply unit 814 supplies deionized water to the concave surface 219a to clean the bottom central part 211 in the non-holding period (specifically, in the period after one substrate 9 has been conveyed out and before the following substrate 9 is conveyed in), in which the substrate holding member 14 is not holding a substrate 9. Therefore, it is possible to prevent, in the overflow processing or the suction processing, the deionized water and the foreign matter or the like removed from the bottom central part 211 by the deionized water from being accidentally stuck to the lower surface 92 of the substrate 9, whereby adverse affection to substrate processing is controlled.

In addition, in the present preferred embodiment, on the outer circumference side of the concave surface 219a, the tapered surface 219b is provided to be inclined obliquely downwardly toward the outer circumferential edge of the bottom central part 211. Then, in the overflow processing, the most part of the deionized water overflowing the bottom central part 211 and the foreign matter or the like flow along the tapered surface 219b and flow out, in an obliquely downward direction, from the bottom central part 211. Therefore, compared to other aspects which do not have the tapered surface 219b and only have the concave surface 219a, the aspect of the present preferred embodiment can reduce a risk that the deionized water flowing out from the bottom central part 211 and the foreign matter or the like will be stuck to the lower surface 92 of the substrate 9, the substrate holding member 14, or the like, whereby adverse affection to substrate processing is controlled.

<2. Modified example>

The preferred embodiment of the present invention is described in the above; however, the present invention can be variously modified without departing from the spirit of the invention.

In the aspect described in the above preferred embodiment, the bottom central part 211 is cleaned during the non-holding period, in which the substrate holding member 14 is not holding a substrate 9; however, in another aspect, the bottom central part 211 may be cleaned during the holding period, in which the substrate holding member 14 is holding a substrate 9.

Figure 10:
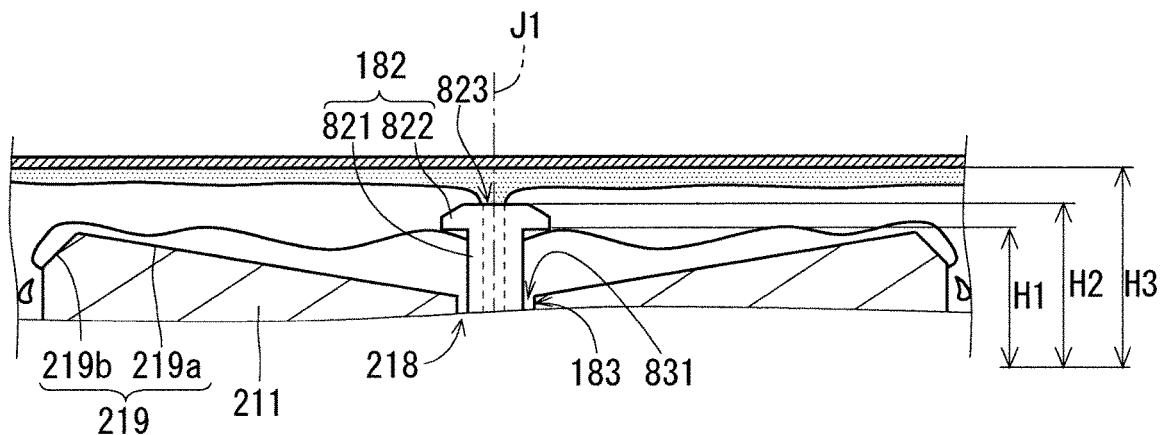

Further, in the aspect described in the above preferred embodiment, there is no overlap between the first period in which the first supply unit supplies chemical liquid toward the lower surface 92 of the substrate 9 and the second period in which the second supply unit supplies deionized water to the concave surface 219a; however, in another aspect, there may be an overlapping period in which the first period and the second period overlap each other. FIG. 10 is an enlarged sectional view showing the bottom central part 211 and the vicinity thereof in such an overlapping period.

As shown in FIG. 10, in the holding period, a height H3 of the held substrate 9 from the reference surface is higher than the height H1 of the liquid surface of the deionized water, in the overflow processing, from the reference surface. That is, in the overflow processing, the lower surface 92 of the substrate 9 is upwardly apart from the liquid surface of the deionized water. In the overflow processing, this arrangement controls sticking of the deionized water and the foreign matter or the like, which are removed from the bottom central part 211 by the deionized water, onto the lower surface 92 of the substrate 9.

Further, as described in FIG. 10, a throughput may be improved in the aspect having the overlapping period with respect to the aspect in which the first period and the second period are separately provided. In addition, in the overlapping period, it is inhibited that the foreign matter or the like which can fall off from the lower surface 92 due to the supply of the chemical liquid to the lower surface 92 falls on the liquid surface above the bottom central part 211 and is directly stuck to the upper surface 219 of the bottom central part 211. Therefore, a possibility is reduced in which the foreign matter or the like resides on the upper surface 219 of the bottom central part 211 and becomes a contamination source. In particular, by starting the second period to perform the overflow processing before the first period is started, even if foreign matter or the like falls off from lower surface 92 in the first period, direct sticking of the foreign matter or the like to the upper surface 219 of the bottom central part 211 is effectively reduced. Further, by continuing the second period to perform the overflow processing after the first period is finished, even if foreign matter or the like falls off from the lower surface 92 in the first period, the foreign matter or the like can be sufficiently removed from the upper surface 219 of the bottom central part 211.

In the aspect described in the above preferred embodiment, deionized water is used as rinsing liquid; however, liquids other than deionized water (for example, carbonated water) may be used as rinsing liquid.

Further, in an aspect, in the overlapping period of the above modified example, the first supply unit may supply the same type of processing liquid as the rinsing liquid for the cleaning of the bottom central part 211, toward the lower surface 92 of the substrate 9; alternatively, the first supply unit may supply a different type of processing liquid (for example, DHF) from the rinsing liquid for the cleaning of the bottom central part 211, toward the lower surface 92 of the substrate 9. Particularly in the former aspect, even if the processing liquid supplied to the lower surface 92 falls on the liquid surface of the rinsing liquid on the bottom central part 211, an adverse affection to the cleaning processing on the bottom central part 211 is reduced because the types of the processing liquid and the rinsing liquid are the same.

Here, the case that the types of the processing liquid and the rinsing liquid are the same includes a case that the processing liquid and the rinsing liquid both are deionized water but the degrees of purity (or impurity concentrations) are different or a case that the processing liquid and the rinsing liquid are both carbonated water but the concentrations of the both are different. On the other hand, the types of the processing liquid and the rinsing liquid are different in a case that the chemical compositions are different for different purposes of liquid processing, for example, in a case that the processing liquid is chemical liquid and the rinsing liquid is deionized water.

Further, in addition to the components of the preferred embodiment, the substrate processing device 1 may further include a third supply unit which has third openings 301 opposed to the lower surface 92 of the substrate 9 held by the substrate holding member 14 and which supplies gas (for example, inert gas such as nitrogen gas or the like or air) from the third openings 301 toward the lower surface 92. FIG. 11 is an enlarged sectional view showing the bottom central part 211 and the vicinity thereof in this modified example.

In this modified example, the height H3, from the reference surface, of each of the third openings 301 of the nozzles protruding from the upper surface 219 of the bottom central part 211 (more specifically, the height H3 is the height of the lowest opening of the third openings 301 from the reference surface) is higher than the height H1, in the overflow processing, of the liquid surface of the deionized water from the reference surface. That is, in the overflow processing, the upper ends of the gas discharging nozzles protrude above the liquid surface of the deionized water. With this arrangement, in the overflow processing, the deionized water and the foreign matter or the like removed from the bottom central part 211 by the deionized water are prevented from entering the gas discharging nozzles from the third openings 301.

Further, in the aspect described in the above preferred embodiment, a suck back valve is used for the suctioning operation in the suction processing after the overflow processing; however, the present invention is not limited to this aspect. In another aspect, the third discharge passage 200 may be opened so that the deionized water stored in the concave surface 219a will be sent to the liquid discharge unit 201 by the weight of the deionized water.

Further, in another aspect, it is possible to previously heat the deionized water to be used to clean the bottom central part 211 or gas to be supplied to the chamber space 120 so that the substrate 9 can be heated to a temperature preferable for the substrate processing.

Other than semiconductor substrates, the substrate processing device 1 may be used to process glass substrates for displays such as a liquid crystal display device, a plasma display, an FED (field emission display), and the like. Alternatively, the substrate processing device 1 may be used to process a substrate for an optical disk, a substrate for a magnetic disk, a substrate for a magneto-optical disk, a substrate for a photomask, a ceramic substrate, a substrate for a solar cell, and the like.

Further, in the substrate processing device 1, another supply unit may be provided to supply other processing liquid than the above chemical liquid, deionized water, and IPA. Other than the aspect in which the first supply unit supplies liquid to the lower surface 92 of the substrate 9 as in the above preferred embodiment, various aspects are also possible in which the first supply unit supplies fluid to the lower surface 92 of the substrate 9 (for example, an aspect in which gas is supplied, or an aspect in which a fluid mixed of gas and liquid is supplied).

Further, in the aspect described in the above preferred embodiment, the lower nozzle 182 is an umbrella-shaped nozzle having the nozzle body 821 and the eave part 822; however, the present invention is not limited to this aspect. The shapes and the numbers of the components can be appropriately changed.

While the invention has been shown and described in detail, the foregoing description is in all aspects illustrative and not restrictive. It is therefore understood that numerous modifications and variations can be devised without departing from the scope of the invention.

What is claimed is:

1. A substrate processing device which performs processing on a substrate, the substrate processing device comprising:
    a substrate holding member which horizontally holds a substrate;
    a first supply unit which has a first opening opposed to a lower surface of said substrate held by said substrate holding member and supplies fluid from said first opening toward said lower surface;
    an opposing part which is non-rotational, and having an upper surface opposed to said lower surface of said substrate held by said substrate holding member and having a concave surface which is recessed on a central side in said upper surface; and
    a second supply unit which has a second opening and supplies rinsing liquid from said second opening to said concave surface, wherein said rinsing liquid is supplied and stored in said concave surface, and a height of said first opening is higher than a height of a liquid surface, of said rinsing liquid supplied to said concave surface, when said rinsing liquid overflows said opposing part.

2. The substrate processing device according to claim 1, wherein said second supply unit supplies said rinsing liquid to said concave surface at a non-holding period in which said substrate holding member is not holding said substrate.

3. The substrate processing device according to claim 1, wherein said second supply unit supplies the rinsing liquid to said concave surface at a holding period in which said substrate holding member is holding said substrate, and a height at which said substrate is held in said holding period is higher than said height of said liquid surface.

4. The substrate processing device according to claim 3, wherein there is an overlapping period between a first period in which said first supply unit supplies said fluid toward said lower surface and a second period in which said second supply unit supplies said rinsing liquid to said concave surface.

5. The substrate processing device according to claim 4, wherein in said overlapping period, said first supply unit supplies toward said lower surface with the same type of processing liquid as said rinsing liquid.

6. The substrate processing device according to claim 4, wherein in said overlapping period, said first supply unit supplies toward said lower surface with a different type of processing liquid from said rinsing liquid.

7. The substrate processing device according to claim 1, further comprising:

a third supply unit which has a third opening opposed to said lower surface of said substrate held by said substrate holding member and supplies gas toward said lower surface from said third opening, wherein a height of said third opening is higher than said height of said liquid surface.

8. The substrate processing device according to claim 1, wherein said upper surface of said opposing part further has, on an outer circumference side of said concave surface, a tapered surface which is inclined in an obliquely downward direction toward an outer circumferential edge, and the height of the boundary part between said concave surface and said tapered surface is lower than the height of said first supply unit.

9. The substrate processing device according to claim 1, wherein said rinsing liquid is supplied to said concave surface from said second supply unit, and said rinsing liquid stored in said concave surface overflows from said opposing part, and thereby an overflow processing for cleaning said upper surface of said opposing part is executed.

10. The substrate processing device according to claim 1, further comprising a liquid discharge unit for sucking said rinsing liquid stored in said concave surface, and cleaning said upper surface of said opposing part by a suctioning operation of said liquid discharge unit.

* * * * *